United States Patent [19]

Yagi et al.

[11] Patent Number: 5,600,249
[45] Date of Patent: Feb. 4, 1997

[54] DETERMINING CONTACT QUALITY OF AN IMPEDANCE METER

[75] Inventors: Kazuyuki Yagi; Yasuaki Komatsu; Masahiro Ikeda, all of Kobe, Japan

[73] Assignee: Hewlett-Packard Company, Palo Alto, Calif.

[21] Appl. No.: 490,355

[22] Filed: Jun. 14, 1995

[30] Foreign Application Priority Data

Jun. 29, 1994 [JP] Japan ................................. 6-170061

[51] Int. Cl.⁶ ..................................................... G01R 31/02
[52] U.S. Cl. ........................... 324/537; 324/525; 324/715; 340/652
[58] Field of Search ...................... 324/521, 522, 324/523, 524, 525, 527, 537, 538, 705, 713, 715, 756; 340/652

[56] References Cited

U.S. PATENT DOCUMENTS

| | | | |
|---|---|---|---|
| 3,866,117 | 2/1975 | Erdman | 324/521 |
| 5,336,990 | 8/1994 | Maue | 324/713 X |
| 5,386,188 | 1/1995 | Minneman et al. | 324/713 X |
| 5,416,470 | 5/1995 | Tanaka et al. | 340/660 |
| 5,489,851 | 2/1996 | Heumann et al. | 324/537 |
| 5,491,424 | 2/1996 | Asar et al. | 324/715 |

*Primary Examiner*—Kenneth A. Wieder
*Assistant Examiner*—Glenn W. Brown

[57] ABSTRACT

An impedance meter enables a real value of a component's impedance value to be forced to be negative when contact between measurement terminals and the component is poor. The value of the real part of the measured value is compared with a standard value for judging whether the contact is good or bad. The contact is judged poor when the real part of the measured value is more negative than the standard value. The standard value for judging whether the contact is good or bad is made more negative than the magnitude of the dispersion of the real part of the measured values, and thus erroneous judgments due to dispersion of measured values are eliminated. The circuit that forces the real part of the measured value to become negative is formed as follows: the input of an inverse gain amplifier is connected to the output terminal of a signal generator, the output of the inverse gain amplifier is connected to a high-voltage voltage terminal through a resistance. A resistance is connected between the high-voltage voltage terminal and ground, a resistance is connected between the output terminal of the signal generator and a low-voltage voltage measurement terminal and a further resistance is connected between the low-voltage voltage terminal and a ground terminal.

8 Claims, 2 Drawing Sheets

DETERMINING CONTACT QUALITY OF AN IMPEDANCE METER

FIELD OF THE INVENTION

This invention concerns, in general, an impedance meter, and in particular, it concerns a device and a method for judging whether contacts between measurement terminals of an impedance meter and the device under test are good or bad.

BACKGROUND OF THE INVENTION

When resistances, impedances, etc., of electronic components are measured, errors are produced in the measured values when the contacts between the device under test and the measurement terminals are imperfect. If poor contact occurs in the process of measuring characteristics of electronic component, there is a possibility that defective components will be shipped as good ones, and good components will be discarded.

In general terms, there are 2 methods for measuring impedance: 2-terminal measurements and 4-terminal measurements. The judgment of whether electrical contact is good or bad, in the case of a 2-terminal measurement, is generally made by the magnitude of the measurement results. In the case of a 4-terminal measurement, there are cases in which this judgment cannot be made solely from the magnitude of the measurement results.

An example may be understood by referring to FIG. 3 which is a diagram illustrating the principle of the 4-terminal measurement method. A high-voltage current terminal Hc and a high-voltage voltage terminal Hp (which are measurement terminals) contact one terminal 4 of device under test 3.

A low-voltage current terminal Lc and low-voltage voltage terminal Lp contact the other terminal 5 of device under test 3. Hc, Hp, Lc, and Lp constitute the 4 terminals. A signal source 1 is connected to high-voltage current terminal Hc through resistance R1, and current is thereby fed to device under test 3. The other terminal of the signal source is grounded or virtually grounded. Low-voltage current terminal Lc is also grounded or virtually grounded.

Measurement current flow is fed from signal source 1, through resistance R1 and measurement terminal Hc, to terminal 4 of device under test 3, and returns via terminal 5, through measurement terminal Lc, to signal source 1. The measurement current is measured by an ammeter in the loop. The current value may also be obtained by measuring the voltage between the ends of resistance R1. Another method is to connect an ammeter 9 to the Lc terminal. In this case, ammeter 9 may comprise an operational amplifier and a resistance to virtually ground the Lc terminal.

The voltage between the terminals of device under test 3, produced by the measurement current, is applied to input terminals 6 and 7 of differential amplifier 8 via high-voltage terminal Hp and low-voltage voltage terminal Lp, respectively, and is measured by a voltmeter 10 that is connected to the output terminal of differential amplifier 8. In ordinary impedance meters, the vector ratio of the values measured by voltmeter 10 and the ammeter 9 is obtained by a calculation process, and is output as the measured value.

Consider the case in which low-voltage voltage terminal Lp becomes open due to a poor contact. In this situation, the measurement current flows normally. Even if terminal Lp is open, when the potential of terminal 7 of differential amplifier 8 has a value close to ground potential, the measured value is close to the value obtained in a normal contact state. That is, contact quality cannot be judged by the magnitude of the measurement result. When this situation occurs in the testing of electronic components, there is a possibility that components that should be judged as being outside the standard and of poor quality will be judged as being of good quality.

In order to solve this problem, a contact judgment circuit and contact judgment method have been proposed in Japan Patent Application No. 3-308485. The invention disclosed therein adds a switch, a direct current source, and a direct current voltmeter to the impedance meter in order to judge the contact of terminal Lp. Therefore, the structure of the meter is more complicated, and its price is increased.

OBJECT OF THE INVENTION

The object of this invention is to provide a means for performing an effective judgment of contact quality when employing 4-terminal measurements in impedance meters, while minimizing any increase in hardware.

SUMMARY OF THE INVENTION

This invention is based upon the fact that, in passive electronic components, the real value (i.e. resistance component) of the impedance does not become negative. A circuit is added to the meter which makes negative the real part of the impedance measurement value in those cases in which contact between the device under test and the measurement terminals is poor. The contact is judged poor if the real part of the measured value is negative.

This invention implements a method for detecting poor contacts of the high-voltage voltage terminal Hp and the low-voltage voltage terminal Lp of a 4-terminal structure. It is possible to detect poor contacts of the Hc and Lc terminals in a 2-terminal measurement, by using the method proposed in Japan Patent Application No. 3-308485, without increasing the required hardware.

Figure 1:
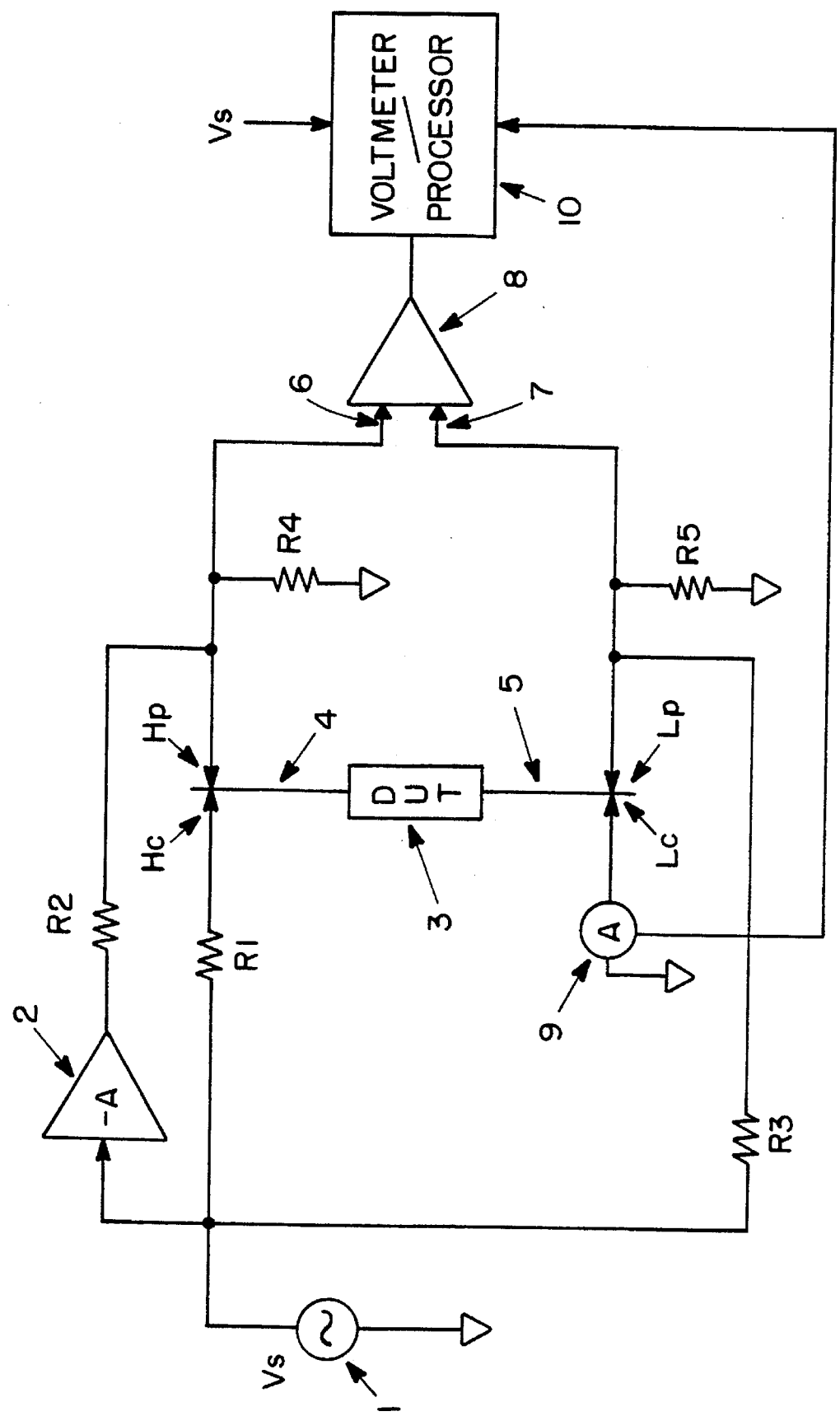
FIG. 1 is a diagram showing a measuring circuit incorporating the invention.

Explanation of Symbols:
1: Signal generator
2: inverting amplifier
3: Device under test
4: Terminal of device under test
5: Terminal of device under test
6: Input terminal of differential amplifier
7: Input terminal of differential amplifier
8: Differential amplifier
9: Ammeter
10: Volt meter/microprocessor
R1: Resistance
R2: Resistance
R3: Resistance
R4: Resistance
R5: Resistance

DETAILED DESCRIPTION OF THE INVENTION

The invention provides a means for judging whether contacts between measurement terminals of an impedance meter and the device under test are good or bad. In particular, since the probability of poor contact is high when there are a large number of contact circuits, i.e., 4-terminal, 5-terminal and 4-terminal-pair structures, an effective method is provided for these meters. Below, the 4-terminal, 5-terminal, and 4-terminal-pair structures will be referred to by the general name "4-terminal structure".

Moreover, in this Specification, the term "impedance" will be understood as including resistances, admittances, etc., and the term "impedance meter" will be understood as including LCR meters, milliohm meters, impedance analyzers, etc.

In passive electrical components or similar devices under test, the real part of the impedance (resistance component) does not become negative. Thus, this invention implements a method in which it is determined that a measurement terminal contact is poor when the real part of the impedance measurement value becomes negative. A means is added that causes the real part to show a negative value when the device under test and the measurement terminals are in poor contact. However, in ordinary impedance meters, because of chance errors of measurement due to noise voltage, etc., there is a certain degree of dispersion of measured values.

Therefore, when devices under test with extremely small resistance components are tested, such as air condensers, the real part of the impedance can become negative by chance, even in normal contact situations. Therefore, erroneous judgments can occur due to a dispersion of measured values, when it is judged, as a result of a real part of an impedance becoming negative, that the contact is poor.

This invention enables such erroneous judgments to be avoided and highly reliable contact quality judgments to be made. The judgment of contact quality is not performed solely by considering the positive and negative values of the real part of the measured values. Negative values are compared with a standard value so as to judge whether the contact is good or bad. A judgment of poor contact is made when the real part of the measured value becomes more negative than the standard value. The absolute value of a standard value for judging contact quality is set to a value greater than the magnitude of the dispersion of the real part of the measured value, and thus the meter is set so that erroneous judgments of poor contact due to dispersion are avoided. This will be explained in detail by the complex plane of the impedance illustrated in FIG. 2.

Figure 2:
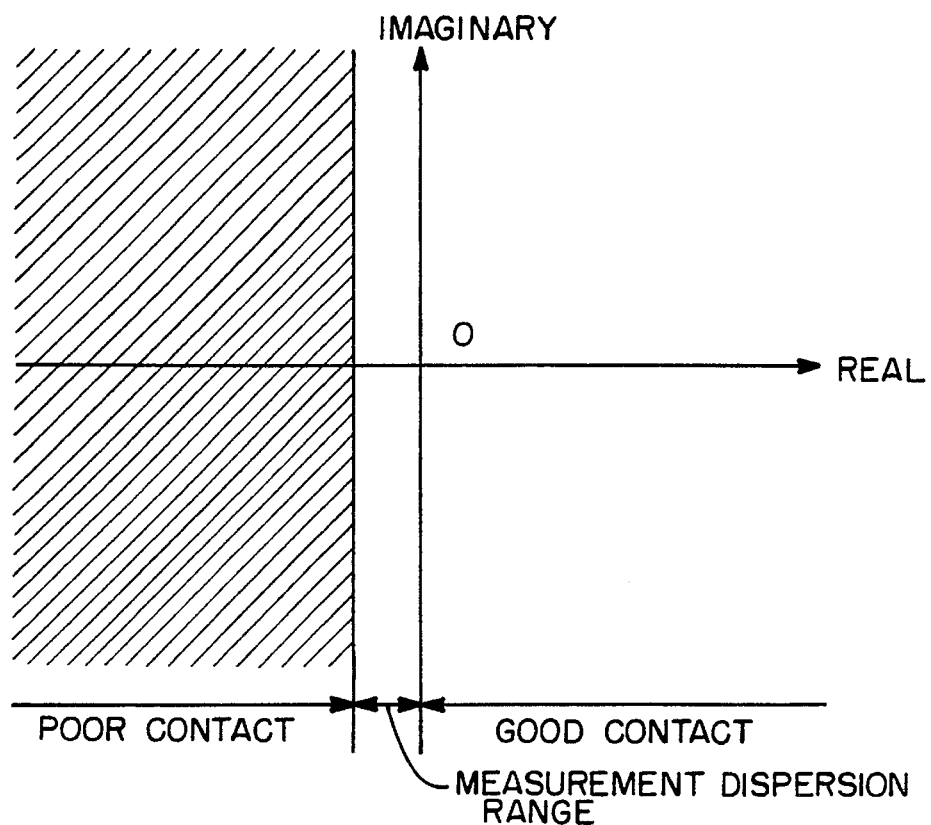
FIG. 2 is a diagram showing a criterion for judging whether measurement contacts are good or bad.

The range on the right side of the imaginary axis of the FIG. 2, that is, the range in which the real part of an impedance is positive, is the range in which impedance measurements are acceptable. The range in which the contact quality is judged poor is the range shown by the shaded area on the left side of the criterion line. The criterion line is not the imaginary axis, but is shifted in the negative direction along the real axis. The range between the criterion line and the imaginary axis is the range in which a measured value can fall by chance due to dispersion, even when the contact is good. Conversely, the criterion line is established in such a way that, when the contact is normal, the measured value does not enter the poor range (shaded region), even though there is a dispersion of measured values. Moreover, when the contact is poor, an erroneous judgment of good contact is avoided, since the real part is forced to become still more negative than the criterion line by a method to be described below.

In FIG. 2, in order to show the basic principle of this invention, the criterion line for judging whether the contact is good or bad is drawn as a straight line parallel to the imaginary axis. It need not be a straight line, so long as the range in which the dispersion of measurements occurs is avoided. Since the dispersion ordinarily varies according to the magnitude of the impedance and the measurement range, it is also possible to make the criterion line an oblique line or a curve, or a combination of the two, in order to achieve an optimal line of demarcation.

Figure 3:
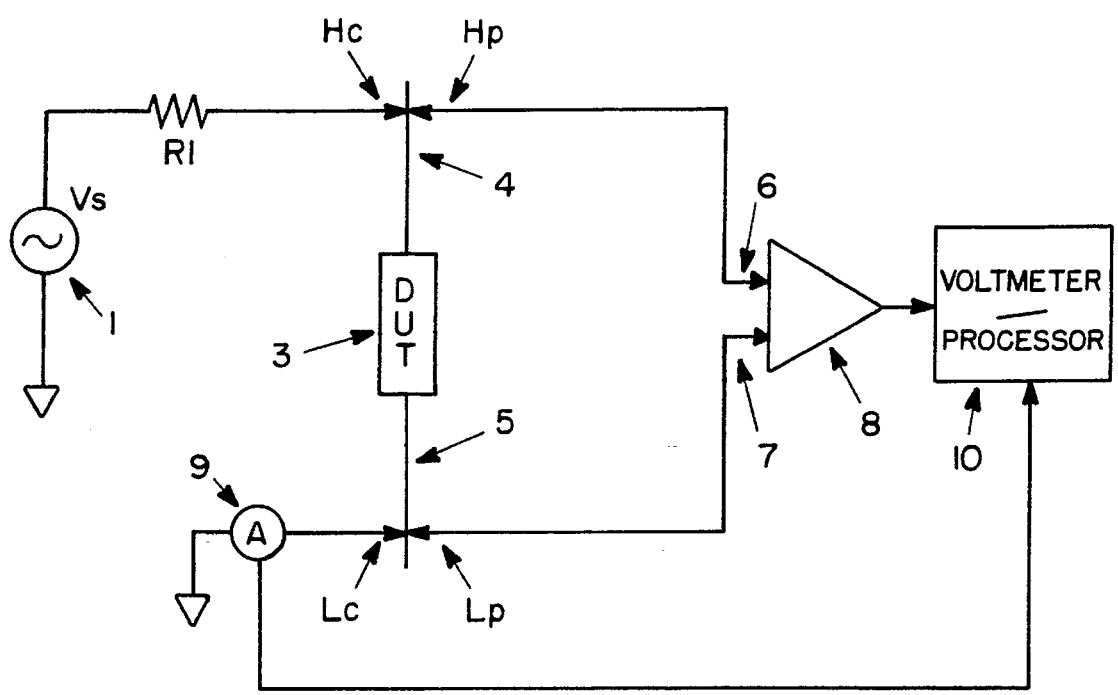
FIG. 3 is a diagram of a circuit for performing 4-terminal measurements.

Next, an embodiment of the invention illustrated in FIG. 1 will be described in which the real value of the measured impedance is forced to be negative in cases in which the contact is poor. The same reference numbers are given to the elements with the same functions as in FIG. 3. In FIG. 1, certain circuit components (which make the real value of the impedance measurement value negative) are added to the elements shown in FIG. 3. The added circuit components comprise an amplifier 2 with a negative gain, i.e., an "inverting" amplifier, and resistors R2, R3, R4, and R5. The input terminal of inverting amplifier 2 is connected to the output terminal of signal generator 1 and the output terminal of inverting amplifier 2 is connected to high-voltage voltage terminal Hp through the resistance R2. Resistance R4 is connected between the high-voltage voltage terminal Hp and a ground terminal. Furthermore, one end of resistance R3 is connected to the output terminal of signal generator 1, and the other end of resistance R3 is connected to low-voltage voltage terminal Lp. Resistance R5 is connected between the low-voltage voltage terminal Lp and a ground terminal.

The values of resistances R2, R3, R4, and R5 are selected so that, in case the various measurement terminals make normal contact, the circuit added for making contact judgments does not affect measurement operations. In such case, the voltage between the ends of the device under test is output by differential amplifier 8, and the impedance is correctly measured.

In case high-voltage voltage terminal Hp makes a poor contact, a voltage $Vs*(-A)*R4/(R2+R4)$ is input into input terminal 6 of differential amplifier 8 (Vs is the output voltage of signal generator 1, and $-A$ is the gain of inverting amplifier 2). The voltage at terminal 7 is almost zero. Therefore, at the output terminal of differential amplifier 8, a voltage with a reverse phase to that of signal generator 1 is output, rather than the voltage between the ends of the device under test. However, since the high-voltage current terminal Hc and low-voltage current terminal Lc make good contact, the current flowing in the device under test is measured correctly. In this case, the measurement current does not exhibit a reverse phase to that of the signal generator 1. Therefore, since the measurement current and voltage are in reverse phase each other, volt meter 10 determines that the real part of the measured value has become negative.

Moreover, the values of R1 to R5 and the gain of differential amplifier 8 are selected so that, when the contact of low-voltage voltage terminal Lp is poor, the voltage at terminal 7 becomes high, due to the voltage of terminal 6, which make good contact. If this occurs, a voltage of opposite phase to the signal generator is output at the output terminal of differential amplifier 8, and voltmeter 10 determines that the real part of the measured value has become negative.

In case both the high-voltage voltage terminal Hp and the low-voltage voltage terminal Lp have poor contacts at the same time, the real value of the impedance becomes negative in the same manner. If the values from R1 to R5 are suitably selected, the absolute value of the negative value will be large, compared to the magnitude of the dispersion of measurements when the contacts are good.

In this manner, the real value of the measured impedance becomes substantially negative, compared to the criterion line in FIG. 2, when terminals Hp and Lp have poor contacts. It is thereby possible to judge whether the contacts to the measurement terminals are good or bad.

In cases of poor contacts of terminals Hc and Lc in a 2-terminal measurement, the judgment of contact quality can be performed by the method proposed in Japan Patent Application No. 3-308485.

As above indicated, the circuit added to judge whether contact is good or bad does not have an affect on the normal measurement operation when the contacts of the various measurement terminals are good. First, the values of resistances R2, R3, R4, and R5 are selected so that their effects are made extremely small, and remaining very small effects are eliminated by corrections.

The values of the resistances are selected as follows. R2 has a high value with respect to R1. Then, when current flowing in the device under test is measured by measuring the voltage between the ends of R1, the current flowing in R2 becomes the measurement error. In order to avoid this, R2 has a high value with respect to the device under test. Since R4 is connected in parallel with the device under test 3, it becomes a measurement error. In order to avoid this, R4 has high value with respect to the device under test. R3 and R5 also have high values with respect to the contact resistances of the terminals Lc and Lp.

In the method of measuring the current flowing in the device under test by connecting ammeter 9 to the Lc terminal, the currents flowing in R3 and R5 become measurement errors; therefore, R3 and R5 have high values to prevent this. In this way, the effects on the measurement of the circuit added to judge whether the contact is good or bad can be reduced when the contacts are good.

As discussed above, the resistance values must be high, compared to the device under test. In other words, the measured value in the normal state of contact is subject to large errors when the impedance of the device under test is high. Therefore, in addition to the aforementioned conditions, an OPEN calibration function is used to eliminate errors due to these resistances. This calibration method is one in which, first, the impedance is measured with the measurement terminals in an open condition, and the device under test is then connected and the impedance is measured; a correction is performed on this measured value by calculation to eliminate the error. The OPEN calibration method is a 3-term calibration methods, see Japan Patent Application Nos. 5-85545 and 5-352215.

While examples of this invention have been described above, the invention is not limited to the lay-outs, part forms, arrangements, etc., of these examples, and, if desired, modifications of the structure may be performed, as long as the essential elements of this invention are not lost. For example, in the example of FIG. 1, the measurement of alternating-current impedances was discussed, but this invention can also be applied to direct-current resistance meters.

What is claimed is:

1. An impedance meter comprising:

first and second measurement contacts connectable to first and second terminals of a device under test (DUT);

signal generator means for applying a first test signal to said first and second measurement contacts;

third and fourth measurement contacts connectable to said first and second terminals of said DUT;

amplifier means for amplifying the voltage between said third and fourth measurement contacts;

circuit means for applying a second test signal, opposed in phase to said first test signal, to an input of said amplifier, said first test signal being substantially attenuated if a high resistance junction exists between said third measurement contact and said first terminal of said DUT, and enabling said amplifier means to manifest an output signal indicative of the phase of said second test signal; and meter means for comparing a phase of said first test signal and said output signal from said amplifier means to determine a quality of contact between said DUT and at least one said measurement contact.

2. An impedance meter as recited in claim 1 wherein said meter means compares said output signal from said amplifier means with a standard value to judge whether said at least one said measurement contact makes a good or bad connection to said DUT and further determines that a connection is poor when said output signal is more negative than said standard value.

3. An impedance meter as recited in claim 2 wherein said standard value is zero.

4. An impedance meter as recited in claim 2 wherein said standard value is a negative value that is greater than a dispersion of measurements of a real part of an impedance of said DUT.

5. An impedance meter which employs a four-terminal measurement procedure, said impedance meter comprising:

a high voltage current terminal and a high-voltage voltage terminal that are connectable to one end of a device under test (DUT);

a low voltage current terminal and a low-voltage voltage terminal connectable to a second end of a DUT;

a signal source for providing an impedance measurement signal to the DUT, said signal source connected to said high voltage terminal; and means for measuring a current that flows between said high voltage current terminal and said low voltage current terminal and a voltage between said high-voltage voltage terminal and said low-voltage voltage terminal, said means for determining an impedance of said DUT by calculating a vector ratio of current and voltages therein; and means for manifesting a poor contact between said high-voltage voltage terminal and said DUT and a poor contact between said low-voltage voltage terminal and said DUT, said means for manifesting including means to cause a real part of a measured impedance value to be a negative value upon an occurrence of said poor contact.

6. An impedance meter as recited in claim 5 wherein said means for manifesting comprises:

first circuit means including an inverting amplifier having an input connected to said signal source and an output connected to said high-voltage voltage terminal through a first resistor and a second resistor connected between said high-voltage voltage terminal and ground, said second resistor causing a negative real part signal when contact between said high-voltage voltage terminal and said DUT is poor; and second circuit means comprising a third resistor connected between said output terminal of said signal source and said low-voltage voltage terminal and a fourth resistor connected between said low-voltage voltage terminal and ground, for forcing a negative real part impedance measurement signal when contact between said low-voltage voltage terminal and said DUT is poor.

7. An impedance meter as recited in claim 6 wherein the resistance of each of said resistors is higher than a sum of an impedance of said DUT and any contact resistances of said high-voltage voltage terminal and low-voltage voltage terminal when contacts therebetween and said DUT are normal.

8. The impedance meter as recited in claim 7 wherein said meter means includes a calibration function which minimizes errors resulting from an inclusion of said first through fourth resistors.

* * * * *